(12) United States Patent
Clime et al.

(10) Patent No.: US 9,555,382 B2
(45) Date of Patent: Jan. 31, 2017

(54) CENTRIFUGAL MICROFLUIDIC MIXING APPARATUS WITH DEFLECTION ELEMENT, AND METHOD OF MIXING

(71) Applicant: NATIONAL RESEARCH COUNCIL OF CANADA, Ottawa (CA)

(72) Inventors: Liviu Clime, Longueuil (CA); Teodor Veres, Montreal (CA)

(73) Assignee: National Research Council of Canada, Ottawa, Ontario (CA)

( * ) Notice: Subject to any disclaimer, the term of this patent is extended or adjusted under 35 U.S.C. 154(b) by 0 days.

(21) Appl. No.: 13/261,941

(22) PCT Filed: Feb. 18, 2013

(86) PCT No.: PCT/CA2013/000139
§ 371 (c)(1),
(2) Date: Aug. 15, 2014

(87) PCT Pub. No.: WO2013/120190
PCT Pub. Date: Aug. 22, 2013

(65) Prior Publication Data
US 2015/0138912 A1 May 21, 2015

Related U.S. Application Data

(60) Provisional application No. 61/599,647, filed on Feb. 16, 2012.

(51) Int. Cl.
*B01F 13/00* (2006.01)
*B81B 7/00* (2006.01)
(Continued)

(52) U.S. Cl.
CPC ......... *B01F 13/0059* (2013.01); *B01F 5/0606* (2013.01); *B01F 13/0069* (2013.01); *B01F 15/0233* (2013.01); *B81B 7/00* (2013.01)

(58) Field of Classification Search
CPC . B01F 5/0606; B01F 13/0069; B01F 13/0059; B01F 15/0233; B01F 11/0002; B01F 11/0014; B01F 15/0201; B81B 7/00
(Continued)

(56) References Cited

U.S. PATENT DOCUMENTS 3,795,451 A * 3/1974 Mailen .................. B01F 5/0068
250/576
3,829,223 A * 8/1974 Hamel ................ B01F 13/0016
250/576
(Continued)

FOREIGN PATENT DOCUMENTS

EP 2047910 4/2009

OTHER PUBLICATIONS

Bhagat AAS, et al. (2007) A passive planar micromixer with obstructions for mixing at low Reynolds numbers. J. Micromech. Microeng. 17, 1017-1024.
(Continued)

*Primary Examiner* — Charles Cooley
(74) *Attorney, Agent, or Firm* — Jason E. J. Davis (57) ABSTRACT

A centrifugal microfluidic device having a microfluidic mixing element with a microfluidic mixing chamber in which at least two flows emerging from channels into the chamber at separate places are redirected to land at substantially the same place on a mixing surface provides efficient mixing of two or more fluids in the chamber.

14 Claims, 4 Drawing Sheets

(51) Int. Cl.
*B01F 5/06* (2006.01)
*B01F 15/02* (2006.01)

(58) Field of Classification Search
USPC .............. 366/237, 341, DIG. 1–DIG. 4
See application file for complete search history.

(56) References Cited

U.S. PATENT DOCUMENTS

| | | | | |
|---|---|---|---|---|
| 4,279,862 | A * | 7/1981 | Bretaudiere | B01F 5/0619 |
| | | | | 356/246 |
| 4,515,889 | A * | 5/1985 | Klose | B01F 5/064 |
| | | | | 422/548 |
| 5,093,084 | A | 3/1992 | Boden et al. | |
| 5,826,981 | A | 10/1998 | Fowler et al. | |
| 6,241,379 | B1 | 6/2001 | Larsen | |
| 6,916,113 | B2 * | 7/2005 | Van de Goor | B01F 11/0042 |
| | | | | 366/108 |
| 6,994,749 | B2 | 2/2006 | David | |
| 7,314,060 | B2 | 1/2008 | Chen et al. | |
| 7,316,245 | B2 | 1/2008 | Bivin | |
| 7,347,617 | B2 | 3/2008 | Pugia et al. | |
| 8,372,579 | B2 | 2/2013 | Toner et al. | |
| 8,511,889 | B2 * | 8/2013 | Choikhet | B01F 5/064 |
| | | | | 138/40 |
| 8,534,909 | B2 * | 9/2013 | Guidat | B01F 5/0603 |
| | | | | 366/336 |
| 9,393,535 | B2 * | 7/2016 | Xia | B01F 5/0645 |
| 2001/0043894 | A1 | 11/2001 | Gillis et al. | |
| 2008/0056063 | A1 * | 3/2008 | Cho | B01F 11/0002 |
| | | | | 366/228 |
| 2009/0087925 | A1 * | 4/2009 | Wagner | B01F 5/061 |
| | | | | 436/518 |
| 2009/0092526 | A1 | 4/2009 | Miller | |
| 2010/0120077 | A1 | 5/2010 | Daridon | |
| 2011/0043894 | A1 | 2/2011 | Sprague et al. | |
| 2011/0306043 | A1 | 12/2011 | Fuchs et al. | |
| 2012/0055798 | A1 | 3/2012 | Selden et al. | |
| 2014/0134631 | A1 * | 5/2014 | Clime | |
| 2015/0138912 | A1 * | 5/2015 | Clime | B01F 5/0606 |
| | | | | 366/165.2 |

OTHER PUBLICATIONS

Burger R, et al. (2009) Droplet Mixer based on Siphon-Induced Flow Discretization and Phase Shifting. 2009 IEEE 22nd International Conference on Micro Electro Mechanical Systems. 443-446.
Capretto L, et al. (2011) Micromixing Within Microfluidic Devices. Top Curr Chem. 304, 27-68.
Coleman JT, et al. (2006) High-efficiency electrokinetic micromixing through symmetric sequential injection and expansion. Lab on a chip. 6(8), 1033-1039.
Grumann M, Geipel A, et al. (2005) Batch-mode mixing on centrifugal microfluidic platforms. Lab on a chip. 5(5), 560-565.
Lee C.-Y, et al. (2011) Microfluidic mixing: a review. International journal of molecular sciences. 12(5), 3263-3287.
Noroozi Z, et al. (2009) Reciprocating flow-based centrifugal microfluidics mixer. The Review of scientific instruments. 80(7), 075102-075102.
Robertson RM, et al. (2006) Diffusion of isolated DNA molecules: dependence on length and topology. Proceedings of the National Academy of Sciences of the United States of America. 103(19), 7310-7314.
Stroock AD, et al. (2002) Chaotic mixer for microchannels. Science. 295(5555), 647-651.
Suh YK, Kang S. (2010) A Review on Mixing in Microfluidics. Micromachines. 1(3), 82-111.
Teh S-Y, et al. (2008) Droplet microfluidics. Lab on a Chip. 8, 198-220.
International Search Report for corresponding PCT application No. PCT/CA2013/000139, Apr. 2013.
Written Opinion for corresponding PCT application No. PCT/CA2013/000139, Apr. 2013.

* cited by examiner

CENTRIFUGAL MICROFLUIDIC MIXING APPARATUS WITH DEFLECTION ELEMENT, AND METHOD OF MIXING

CROSS-REFERENCE TO RELATED APPLICATIONS

This application is a national phase entry of International Patent Application No. PCT/CA2013/000139 filed Feb. 18, 2013 and claims the benefit of U.S. Provisional Patent Application Ser. No. 61/599,647 filed Feb. 16, 2012 the entire contents of both which are herein incorporated by reference.

FIELD OF THE INVENTION

The present invention is related to centrifugal microfluidic devices, in particular to centrifugal microfluidic devices having means for mixing fluids and to methods for mixing fluids in a centrifugal microfluidic device.

BACKGROUND OF THE INVENTION

Microfluidic devices are having an increasing impact on biomedical diagnostics and drug development. Centripetal (or centrifugal) microfluidics in particular can deal with very small volumes of liquid, usually in the microliter range. At such a small scale, the surface to volume ratio of flowing liquids increases drastically, while at the same time the specific Reynolds number becomes very small (typically less than 1). In such Reynolds number regimes the flow is always laminar, turbulences of any kind being completely forbidden. This is a serious drawback for mixing two or more liquids since, in the absence of any turbulence, diffusive mixing is the only available mechanism. This is an inherently very slow process. At the microfluidic scale, diffusion lengths of at least hundreds of microns are necessary, and for diffusion constants on the order of $10^{-12}$ (e.g. for DNA molecules (Robertson 2006)) corresponding diffusion times of about several tens of minutes are unavoidable. Consequently, the aim of any microfluidic mixing scheme is to enhance performance of the mixing process and achieve certain mixing performance within a minimum footprint and time.

There are few recent and good review articles for the state of the art in microfluidic mixing (Suh 2010; Capretto 2011; Lee 2011). As pointed out by these articles, while classical continuous microfluidics has been the field of several advancements and innovations in this matter, there is much on-going research and unsolved problems in centrifugal microfluidic mixing field. For the most part, mixing applications are designed by directly transferring knowledge from traditional microfluidic mixing to centrifugal microfluidics. In a recent example (Grumann 2005), a centrifugal microfluidic platform is achieved by magnetically stirring beads in a mixing chamber or by generating inertia effects trough sudden accelerations and decelerations of the platform. In another example (Noroozi 2009), Coriolis force and alternate spinning is used for the same purpose. In a relatively different approach, mixing in the channels can be achieved by generating vortices through appropriate twisting the flow with various ridge- and herringbone-structures (Stroock 2002). However, in principle, any other method of mixing used in traditional microfluidics either active (acoustic, ultrasonic, dielectrophoretic, electrodynamic, electrokinetic, etc.) or passive (lamination, zigzagging, 3D serpentines, etc.) can be used. The price to pay for this simple transfer of technology from traditional to centrifugal microfluidics is the complexity of both actuation and handling and the final fabrication cost per unit device. These approaches are generally not appropriate for centrifugal microfluidic devices and do not take advantage of several features these platforms may offer.

In recent work (Coleman 2006), a sequential (active) injection of liquids in the same channel followed by an expansion chamber for enhancing diffusive mixing may be employed. Similarly, the ability to generate very small liquid droplets by simply terminating microfluidic channels with a large reservoir (chamber) and putatively alternating liquid layers may be employed (Burger 2009). However, this approach results in inefficient mixing. As a consequence, the mixing time obtained is too long.

There remains a need for efficient mixing of fluids in a centrifugal microfluidic device.

SUMMARY OF THE INVENTION

It has now been found that a centrifugal microfluidic device having a microfluidic mixing element comprising a microfluidic mixing chamber in which at least two fine flows of liquids (such as flows that are necessarily produced by microfluidic channels with hydraulic diameters of 1 mm or less, more preferably 5-600 µm, more preferably 10-200 µm, with flows of typical aqueous solutions and colloids, and solvents, under typical centrifugal fields) emerge from channels into the chamber at separate places, are redirected to land at substantially the same place on a mixing surface, provides efficient mixing of the two or more fluids in the chamber. The fluid flows may be droplets, or fine enough streams that under vibration of the system, and/or upon impact with the mixing surface, the flow behaves as if it was individual droplets.

Thus, in one aspect of the invention, a centrifugal microfluidic device is provided, the device comprising a microfluidic mixing chamber with at least two outlets to respective microfluidic channels with hydraulic diameters less than 1 mm, for permitting fluid flows to enter the chamber from each channel under the influence of a centrifugal field. The inlets are spaced apart so that trajectories of the fluid intersect a mixing surface in the chamber at substantially different places on the surface. The chamber has at least one deflection element situated in the trajectories, the at least one deflection element oriented to deflect the flow so that the deflected flows contact the mixing surface at substantially a same place on the surface. A trajectory from the deflection element to the mixing surface has a distance of at least 1 mm, so that microscopic amounts of the fluid flows impact the surface, or the previously deposited fluid, spreading out to form a stack of alternating thin layers of the respective fluids, providing a large surface area for diffusion.

In another aspect of the invention there is provided a method for mixing at least two flows of fluid in a centrifugal microfluidic device, the method comprising: providing at least two microfluidic inlets in a mixing chamber of the device with hydraulic diameters less than 1 mm; creating a fluid flow through each inlet under influence of a centrifugal field, the inlets spaced apart in the chamber so that straight line trajectories of the flows intersect a mixing surface in the chamber at substantially different places on the surface; and deflecting the fluid flows before the flows contact the mixing surface so that the flows contact the mixing surface at substantially the same place; providing an unobstructed trajectory between the deflector and mixing surface having a distance of at least 1 mm so that microscopic amounts of the fluid flows impact the surface, or the previously deposited fluid, spreading out to form a stack of alternating thin layers of the respective fluids, providing a large surface area for diffusion.

Fluids in microfluidic devices are stored in reservoirs and are moved around the device through channels under the influence of a centrifugal field generated by rotation of the device around a rotation axis of a microfluidic platform, and/or by micropumps. The reservoir may contain: a liquid, a liquid suspending a as or solid, a liquid potentially containing a cell, a liquid potentially containing a virus, a liquid potentially containing a bacteria, a liquid potentially containing particulate matter, a liquid potentially containing particulate matter that is surface activated, or a liquid potentially containing a magnetic particle. Fluids tend to move radially away from the rotation axis in the plane of rotation of the device in the direction of the centrifugal field. In many microfluidic applications, it is necessary to mix two or more fluids. Under the influence of the centrifugal field, fluids stored in reservoirs can be moved as flows of fluid through channels into a single mixing chamber for mixing. Fluid control devices and metering devices are known. The fluids emerge into the chamber through spaced-apart inlets. The inlets are generally spaced-apart by at least a distance of the same order of magnitude as the diameter of the channels. Inlet separation should be small enough that the deflection element spans the inlets so that the deflection element remains situated in the trajectories of the flows, accounting for any misalignment of the device with respect to the centrifugal field. While a larger spacing between the inlets can still be functional this may require one or more larger deflection elements and a larger mixing chamber.

In the present invention, at least two fluid flows, for example 2, 3, 4, 5 or more flows, entering the mixing chamber are redirected by a deflection element to contact the mixing surface at substantially the same place. The separation distance between microscopic amounts of the fluids that constitute being at, the "same place" according to this invention, is preferably less than a diameter of individual flows, or less than the hydraulic diameter of the channel that defined the flow. It will be appreciated that the microscopic amounts will strike the mixing surface in slightly different spots depending on noise and vibrations of the centrifuge, and vibrations in the mixing chamber. So the landing points will be expected to be distributed, for example in a Gaussian distribution centered on a mean landing point at or near the intersection point between the mixing surface and a radius that goes through the last deflection element detachment point. If the path from deflection element to the mixing surface is not too large, the standard deviation of the distribution may not be larger than the diameters of the individual flows.

Initially, the mixing surface is a bottom surface of the mixing chamber, which the flows strike. As the volume of bulk fluid mixture increases in the chamber, the mixing surface becomes the surface of the bulk fluid mixture. The mixing surface is preferably substantially orthogonal to the centrifugal field, to maximize deformation of the microscopic amounts of fluid. Microscopic amounts landing on the mixing surface spread out into thin layers (lamellae). The thickness of the lamellae depends on the diameter of the mixing chamber, the gradient of the centrifugal field, the fluid flow rate and the wetting properties of the fluids with respect to the solid material from which the device is fabricated, and the distance between the detachment point on the deflector, and the mixing surface. The thickness of the lamellae may be one order of magnitude less than the diameter of the flow, or thinner. Fluid from the two flows tend to land in alternation on the mixing surface, thus, successive lamellae of the different fluids are formed.

In order to achieve a desired mixing, the path from the deflection element and mixing surface should be large enough that the microscopic amounts of fluid have sufficient momentum on striking the mixing surface (or the previously deposited fluid), to substantially deform. It will be appreciated that the impact on the microscopic amount of fluid is not expected to be the same whether the relatively hard mixing surface is struck, or a relatively thin layer of the mixed fluid is struck, or a relatively deep layer of the mixed fluid is struck. A hard initial surface is expect to lead to the greatest deformation of the microscopic amount of fluid, leading to a highest surface area/volume ratio for the first microscopic amounts, thereby allowing the greatest diffusion for the initially mixed fluid. While the later added microscopic amounts may not deform as highly as the initially added microscopic amounts, but the later additions are meeting a more homogeneous mixture, and alternating splats of the two fluids will discourage assembly of large volumes of the same unmixed fluids. Diffusion around the microscopic amounts of different compositions is a continuous process around the total surface areas bordering the unmixed fluids. When the microscopic amounts are small enough, and the inertia imparted to the particles is sufficient, mixing is virtually instantaneous for fluids having typical diffusion rates.

To achieve the desired momentum, it is preferable to maintain a separation of at least 1 mm between the point of detachment on the deflector and the mixing surface, although slightly smaller separations may work for some fluids in some centrifugal fields. Preferably the separation is from 1-5 mm, more preferably 1-3 mm.

To redirect fluid flows entering the mixing chamber, it is preferable to use one or more deflection elements. The deflection element preferably comprises a solid feature engineered into the chamber situated in the trajectories of the flows. The deflection element may have any suitable design for guiding the fluids from their separate paths onto the same landing point. For example, the deflection element may comprise single or multiple (e.g. 2, 3, 4, 5, etc.) wing configurations where the wings are of any suitable size and/or shape (e.g. straight, curved or a combination thereof). Multiple wing configurations preferably comprise a series of staggered wings in which the orientation of at least one wing is in a negative direction with respect to the other wings, where the direction of the centrifugal field is taken as the normal. The deflection element can be generally conceived of as any assembly of geometrical features that collect flows from multiple channels and deflect them to a common landing point into the mixing chamber.

Some initial mixing of fluids can occur on the deflection element, but this is not expected to be extensive. Mixing on the deflection element is in proportion to the surface area along which the two fluids are in contact, and the duration. In practice, the two flows generally leave the channels in flows of individuated droplets or streaks (with some variable volume rates) with some randomness. Thus, the role of the deflection element is to guide the different flows to the same landing point on the mixing surface in the mixing chamber to generate a multilayer structure that favors diffusive mixing.

The present invention may be embodied on a simple passive centrifugal device providing a microfluidic mixing chamber with enhanced diffusive mixing by flow discretization, flattening, and alternate stacking of the two fluids to be mixed. Remarkably an almost instantaneous ("as-they-flow") mixing of two or more fluids has been observed. A separate mixing step may not be required as mixing occurs as the fluid flows through the device. The mixing chamber may be optimized for accurate control of flow discretization and diffusive mixing without any increase in complexity of the device. In contrast with other mixing approaches available in the art, the present invention allows thorough mixing of fluids as they flow into a chamber, the only limiting factor being the fluid flow rate, which could be multiplied by increasing a number of channels from the reservoirs to the mixing chamber, and attendant deflectors. Further, mixing is independent of the materials used so the device can be fabricated in any material that supports microfluidic circuitry.

Fabrication of microfluidic devices containing a microfluidic mixing element of the present invention can be accomplished by any suitable microfabrication technique, for example machining, hot embossing, 3D printing, injection molding and photolithography.

The present invention can be applied as an enabling (or performance-enhancing) tool for the fabrication of devices for any kind of microfluidic application including miniaturized reactors, fluidic systems, cell culture platforms, biosensing, blood testing, sample preparation for bacteria, rare cell capture or molecule capture.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which:

FIG. 2 depicts experimental results when the microfluidic mixer of the prior art depicted in FIG. 1A is used in an attempt to mix two flows of fluid.

FIG. 3 depicts experimental results when the microfluidic mixer of the present invention depicted in FIG. 1C is actually used in an attempt to mix two flows of fluid.

FIG. 4 depicts schematic designs for microfluidic mixing elements for three flows of liquid from three channels using one (FIG. 4A), two (FIG. 4B) or three (FIG. 4C) rectangular deflection elements.

FIG. 5 depicts 3D illustrations of embossed (or CNC machined) structures for the microfluidic mixing element design of FIG. 4A, where FIG. 5A depicts one embossing level and FIG. 5B depicts two embossing levels in which arriving channels are shallower than the mixing chamber and deflection element.

DESCRIPTION OF PREFERRED EMBODIMENTS

The present invention comprises a microfluidic mixer in a microfluidic centrifugal device in which two or more liquid flows are efficiently mixed together in a mixing chamber.

Figure 1A:
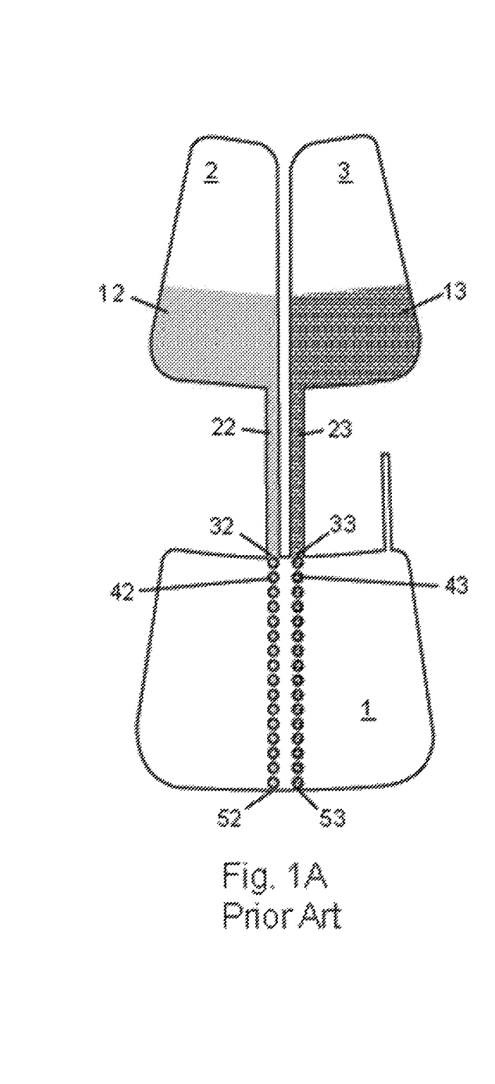
FIG. 1A is a schematic illustration of a microfluidic mixer of the prior art (Burger 2009) comprising two fluid reservoirs connected to a chamber through two microfluidic channels, where parallel, spaced trajectories of fluid flows lead to inefficient mixing or an absence of mixing.

Referring to FIG. 1A, in a prior art microfluidic application (e.g. Burger 2009) where streams of liquid 12 and 13 flow simultaneously from reservoirs 2 and 3, respectively, to chamber 1, the flows arrive at inlets 32 and 33 from microfluidic channels 22 and 23, respectively, and the flow is fractionated into flows (streams of small droplets 42 and 43 shown), respectively. The size of these droplets is dictated by the strength of the centrifugal field, the capillary forces at the inlet and the geometry of the inlet. As the droplets are released at two different points (i.e. inlets 32 and 33) they will be accelerated in the radial direction (i.e. in the direction of the centrifugal field) to land at two different points 52 and 53, respectively. Since these two points are relatively far from each other, the two liquids will tend to accumulate in each half of the chamber to form separate pools of each liquid, with a mixing interface determined largely by the radial cross section of the chamber. Since this interface has a very small relative surface area, diffusive mixing will be very poor. For this reason, most microfluidic applications require an additional mixing step at this stage to accelerate mixing between the two liquids.

Figure 1B:
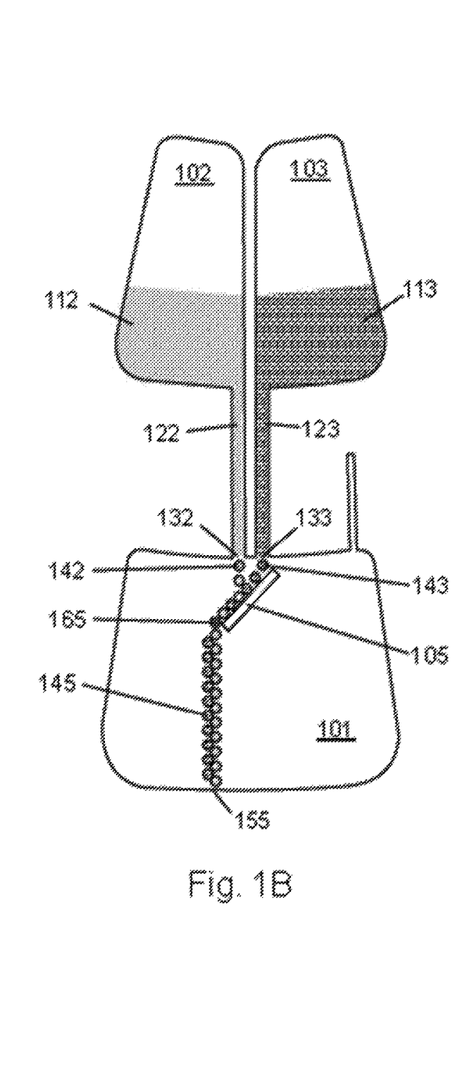
FIG. 1B is a schematic illustration of a microfluidic mixer of the present invention comprising two fluid reservoirs connected to a mixing chamber through two microfluidic channels where trajectories of fluid flows are redirected by a single deflection element placed in the mixing chamber.

Referring to FIG. 1B, in one embodiment of the present invention, reservoirs 102 and 103 provide two liquids 112 and 113 that flow through microfluidic channels 122 and 123 under the influence of a centrifugal field to emerge as individual flows 142 and 143 (shown as droplets) into mixing chamber 101 at inlets 132 and 133. A single straight, rectangular deflection element 105 is placed in the trajectory of both flows 142 and 143, which deflects the two flows to form a joint flow 145 (schematically illustrated), forcing both flows to land at a same nominal point 155 in mixing chamber 101. Instead of following straight line trajectories from inlets 132 and 133 as in FIG. 1A, the flows impact on the deflection element after a short drop (although no drop here is required), and runs along the deflector to a common detachment point 165. The joint flow leaves the deflection element at the detachment point 165 to follow a radial trajectory, as there is no obstruction to the trajectory between the detachment point and a point on the mixing surface 155. Since the flow strikes the same point 155, the liquids, instead of tending to develop separate pools, will stack upon each other forming thin lamellae with very small volume (practically the volume of a single droplet, or a microscopic amount of the fluid that is separated in passage as a joint flow, or at impact) but with very large interfacial surface area provided by the lamellae in the stacking direction. Since the surface to volume ratio is increased enormously, diffusive mixing is expected to occur quickly, and in some cases, practically instantaneously.

It will be appreciated that the shapes and aspect ratios of the reservoirs, channels, and mixing chamber are substantially irrelevant to the present invention, as long as the centrifugal field allows for the desired fluid motion. The volume of the mixing chamber as a function of height of the mixed fluid is one feature that can impact the quality of mixing, as it affects the distance between the detachment point and the mixing surface.

Figure 1C:
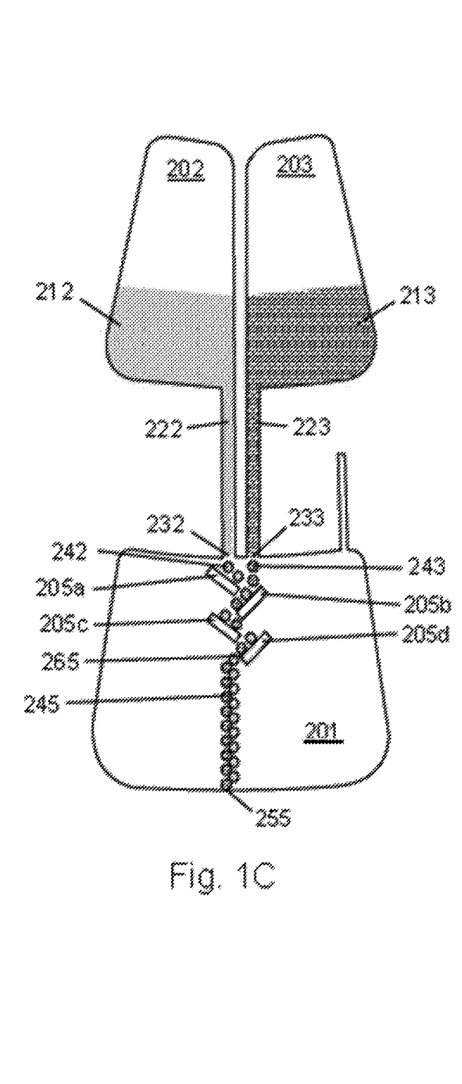
FIG. 1C is a schematic illustration of a microfluidic mixer of the present invention comprising two fluid reservoirs connected to a mixing chamber through two microfluidic channels, where trajectories of fluid flows are redirected by a design of multiple-wing deflection elements placed in the mixing chamber.

Referring to FIG. 1C, in another embodiment of the present invention, reservoirs 202 and 203 provide two liquids 212 and 213 that flow through microfluidic channels 222 and 223 under the influence of a centrifugal field to emerge as individual flows 242 and 243 into mixing chamber 201 at inlets 232 and 233. A four-wing deflection element 205a-d comprising four straight rectangular pieces is placed in the trajectories of both flows 242 and 243, which will deflect the flows to form a joint flow 245 and force the joint flow to land at a common point 255 in mixing chamber 201. Instead of following radial trajectories from inlets 232 and 233 as in FIG. 1A, the flows impact on the deflection elements and the joint flow leaves the deflection element at the same point 265 to follow a radial trajectory. Since the flows arrive at the same point 255, the liquids, instead of tending to develop separate pools, stack upon each other forming thin lamellae with very small volume (practically the volume of a single droplet, or microscopic amount) but with very large interfacial surface areas provided by the multitude of lamellae in the stacking direction. Since the surface to volume ratio is increased enormously, diffusive mixing occurs more quickly, and in some applications may be practically instantaneous.

With reference to FIG. 2 and FIG. 3, the difference can be seen between the behaviors of two liquids landing at separate places (FIG. 2) as opposed to landing at the same place (FIG. 3) on a mixing surface. FIG. 2 shows experimental results for the prior art arrangement without deflection element (e.g. Burger 2009) while FIG. 3 shows experimental results for the present invention using a four-wing deflection element. Reference numerals 301, 401, designate the same features as reference numerals 1 and 101, respectively of FIGS. 1A, and 1B. Likewise, reference numerals 302, 402, correspond with reference numerals 2, 102; reference numerals 203, 403 correspond with 3, 103; 322 and 422 correspond with 22 and 122; and 323 and 423, correspond with 23 and 123.

Figure 2A:
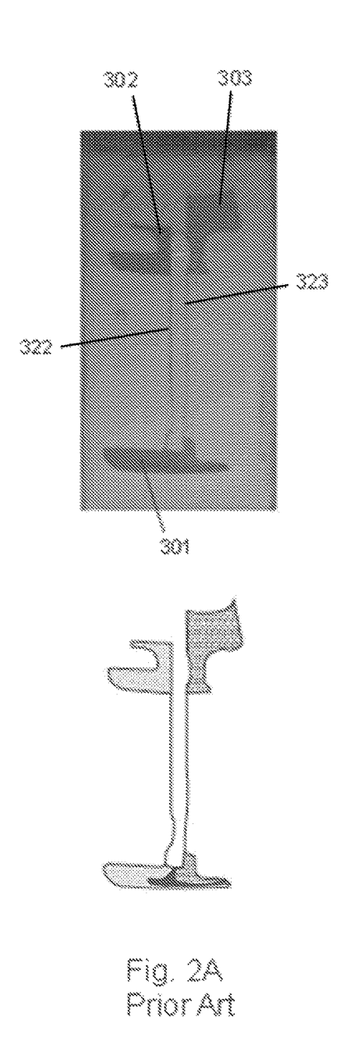
FIG. 2A depicts configuration of liquids when flow has just started.
Figure 2B:
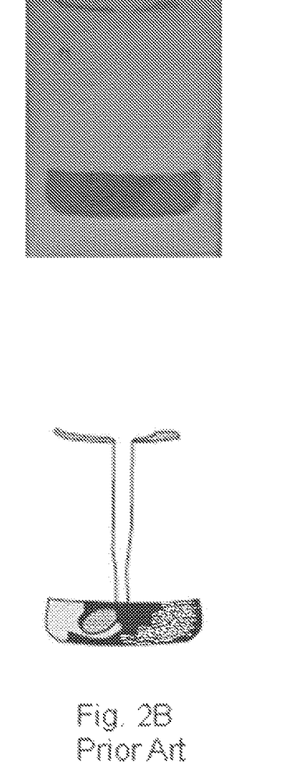
FIG. 2B depicts configuration of liquids at the end of the flow.
Figure 2C:
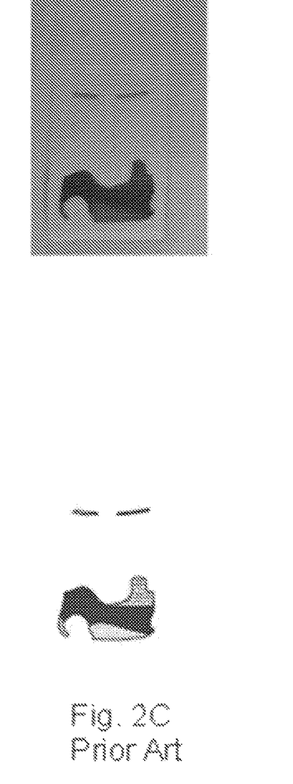
FIG. 2C depicts configuration of liquids 5 minutes after the end of the flow.

Referring to FIG. 2, microfluidic devices were formed of hot embossed PDMS (having patterns to define the microfluidic features) on a flat Zeonor substrate. The mixing chamber had a volume of 40 μL, each reservoir had a volume of 20 μL, and the microfluidic channels and openings between the reservoirs and mixing chamber had a hydraulic diameter of about 500 μm. Two differently colored liquids were placed in reservoirs that were connected through straight radial channels to the mixing chamber, as shown in FIG. 1a. The liquids were both deionized distilled water with commercially available food-color. The microfluidic device was mounted to a home-built centrifuge, and operated at a rate of 700+/−10 rpm. No deflection element was used and the two flows land at separated places in the chamber. The progression of liquid flow and mixing is illustrated by the progression from FIG. 2A to FIG. 2C, where: FIG. 2A depicts configuration of liquids when flow has just started; FIG. 2B depicts configuration of liquids at the end of the flow; and FIG. 2C depicts configuration of liquids 5 minutes after the end of the flow. Schematic diagrams beneath each experiment are manually drawn traces that more clearly show the boundaries between the liquids. As can be seen, during the flow the two liquids accumulate in different regions of the chamber thus reducing their mutual interface and reducing related diffusive mixing. At the end of the flow (FIG. 2B) the liquids are still significantly separated from each other and remain separated to a large extent even after 5 min (FIG. 2C). Black-shaded regions in the schematic diagrams represent regions in which mixing has occurred.

Figure 3A:
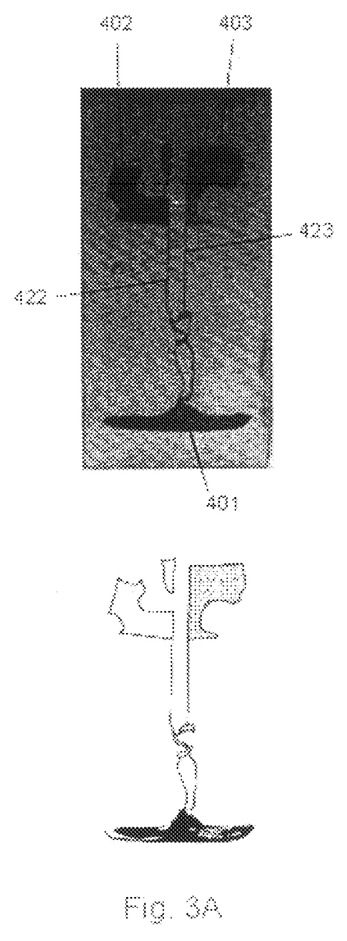
FIG. 3A depicts configuration of liquids when flow has just started.
Figure 3B:
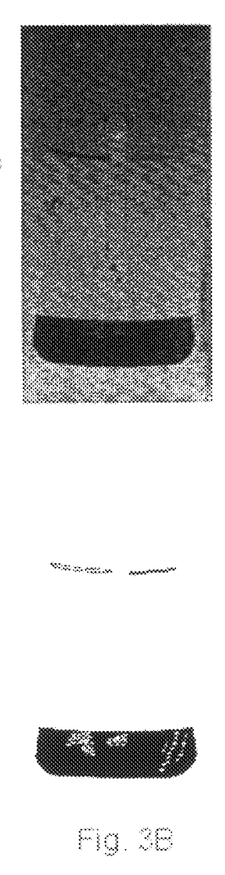
FIG. 3B depicts configuration of liquids at the end of the flow.
Figure 3C:
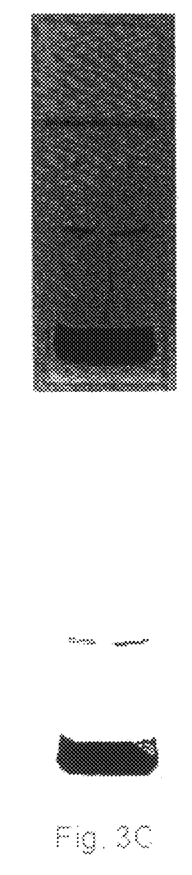
FIG. 3C depicts configuration of liquids five minutes after the end of the flow.

The experiment was repeated with the same materials and equipment, except for the inclusion of the deflectors of FIG. 1c in the mixing chamber. A four-wing deflection element was used and the two flows land at the same place in the mixing chamber. The progression of liquid flow and mixing is illustrated by the progression from FIG. 3A to FIG. 3C, where FIG. 3A depicts configuration of liquids when flow has just started, FIG. 3B depicts configuration of liquids at the end of the flow, and FIG. 3C depicts configuration of liquids 5 minutes after the end of the flow. Schematic diagrams beneath each experiment are manually drawn traces that more clearly show the boundaries, or lack thereof, between the liquids. As can be seen, when the deflection element is present, the liquids are substantially mixed when viewed with small volumes of partially unmixed fluids at both opposite sides, which is consistent with deposition as successive layers. At the end of the flow they are highly mixed (FIG. 3B and FIG. 3C). Black-shaded regions in the schematic diagrams represent regions in which mixing has occurred. By discretizing, deforming, and interlacing the flows, the necessary diffusion lengths and related diffusion times are reduced drastically ($t \propto l^2$).

Figure 4A:
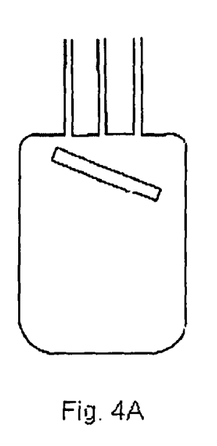
Figure 4B:
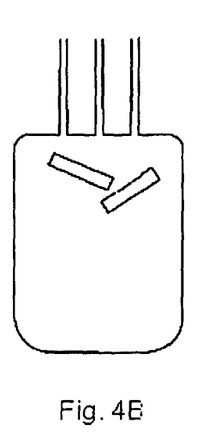
Figure 4C:
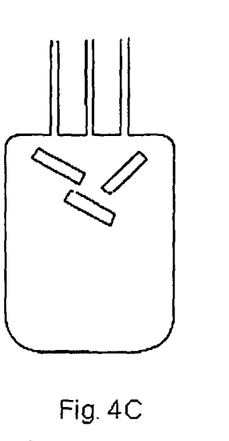

Referring to FIG. 4, the invention can be readily generalized for more than two fluids (e.g. 3, 4, 5 or more fluids) by using either a single-wing deflection element (FIG. 4A) or multiple-wing deflection elements (FIG. 4B and FIG. 4C) in the mixing chamber. The geometry of the deflection element may be varied (e.g. straight or curved) and combinations of curved and straight deflection elements may be employed. FIG. 4B shows a two-wing deflection element and FIG. 4C shows a three-wing deflection element. In FIG. 4A, FIG. 4B and FIG. 4C, three channels for fluid flow are shown entering the mixing chamber.

Figure 5B:
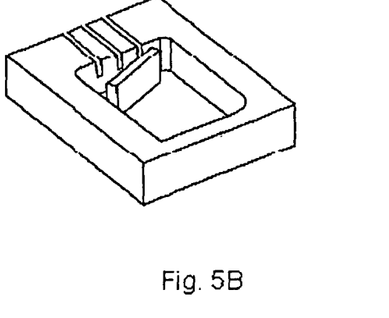

Referring to FIG. 5, devices can be fabricated either by embossing or injection molding a plastic material or by CNC machining of practically any compatible material. The microfluidic channels and the mixing chamber can be carved either at the same level (FIG. 5A) or at different depths (FIG. 5B) by embossing (machining, injection molding) the chamber deeper than the channels.

While the foregoing embodiments showed no exit channel for the mixing chamber, it will be appreciated that many applications of the present invention may use such a channel with or without flow control devices. There may be a variety of structures or chambers connected to the mixing chamber, according to any additional purposes or functions performed in or by the mixing chamber. For example, the mixing chamber may serve as an incubator, or provide for thermal, chemical or radiological treatment, and may have conduits for cleaning or preparing the chamber before or after mixing.

Figure 6:
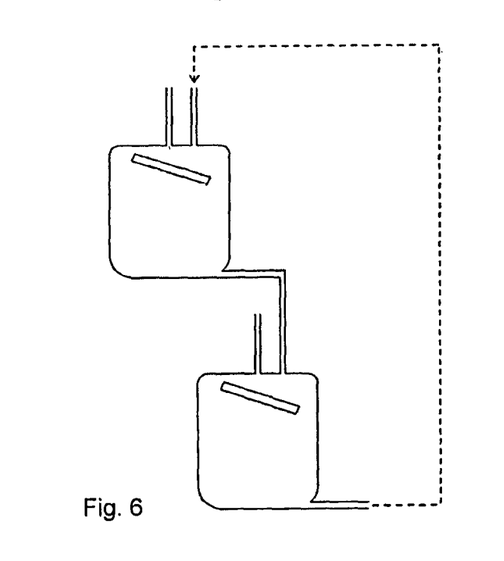
FIG. 6 depicts an embodiment of the present invention having two stages, also showing the possibility of recirculation, and multistage mixing.

FIG. 6 schematically illustrates another embodiment of the present invention that permit multi-stage mixing. Specifically a mixing chamber of the form shown in FIG. 1B, is provided with an exit channel. The exit channel leads to a second mixing chamber shown to be identical to the first.

This arrangement allows for mixing of first and second fluid flows, output at the exit channel, with a third fluid flow, in the second mixing chamber.

The embodiment of FIG. 6 does not require a third fluid flow. In some embodiments it may be preferred to repeat the discretization, deformation, and stacking of the output, to further improve mixing. If the second mixing chamber is only for this purpose, the deflector in the second chamber may be removed.

Furthermore it is known in the art to recirculate fluids through a mixing process iteratively for an established duration, with a view to homogenizing a fluid mixture. It is known in the art to use pumps, such as positive displacement pumps, to recirculate, flow from a mixing chamber outlet back into its inlet. By cycling a first fluid in this manner, and gradually adding the second fluid, mixing may be provided in a manner that may be preferred for some applications.

REFERENCES

The contents of the entirety of each of which are incorporated by this reference.

Bhagat A A S, Peterson E T K, Papautsky I. (2007) A passive planar micromixer with obstructions for mixing at low Reynolds numbers. *J. Micromech. Microeng.* 17, 1017-1024.

Bivin D B. (2008) Fluid Flow Control Device. U.S. Pat. No. 7,316,245 issued Jan. 8, 2008.

Boden H, Rentz B, Ersfeld H, Nadolski K. (1992) Apparatus for the Continuous Preparation of a Liquid Reaction Mixture from Two Fluid Reactants. U.S. Pat. No. 5,093,084 issued Mar. 3, 1992.

Burger R, Reis N, et al. (2009) Droplet Mixer based on Siphon-Induced Flow Discretization and Phase Shifting. *2009 IEEE 22nd International Conference on Micro Electro Mechanical Systems.* 443-446.

Capretto L, Cheng W, Hill M, Zhang X. (2011) Micromixing Within Microfluidic Devices. *Top Curr Chem.* 304, 27-68.

Chen J-J, Wu J-W. (2008) Fluid Flow Conducting Module. U.S. Pat. No. 7,314,060 issued Jan. 1, 2008.

Coleman J T, McKechnie J, et al. (2006) High-efficiency electrokinetic micromixing through symmetric sequential injection and expansion. *Lab on a chip.* 6(8), 1033-1039.

David P R. (2006) Microfluidic Device for Parallel Delivery and Mixing of Fluids. U.S. Pat. No. 6,994,749 issued Feb. 7, 2006.

Fowler J E, Hsei P K. (1998) Apparatus for Mixing Laminar and Turbulent Flow Streams. U.S. Pat. No. 5,826,981 issued Oct. 27, 1998.

Gillis P A, Braun H, Schmidt J, Verwijs J W, Velten H, Piatkowski K. (2011) Tubular Reactor, Process for Conducting Liquid/Liquid Multiphase Reactions in a Tubular Reactor, and a Process for Ring-Nitrating Aromatic Compounds in a Tubular Reactor. United States Patent Publication US 2011/0043894 published Nov. 22, 2011.

Grumann M, Geipel A, et al. (2005) Batch-mode mixing on centrifugal microfluidic platforms. *Lab on a chip.* 5(5), 560-565.

Larsen U D. (2001) Micro Mixer Having a Mixing Chamber for Mixing Two Liquids Through the Use of Laminar Flow. U.S. Pat. No. 6,241,379 issued Jun. 5, 2001.

Lee C.-Y, Chang C-L, et al. (2011) Microfluidic mixing: a review. *International journal of molecular sciences.* 12(5), 3263-3287.

Link D R. (2009) Microfluidic device and method. European Patent Publication EP 2047910 published Apr. 15, 2009.

Link D, Hutchinson B, Weiner M, Samuels M. (2010) Droplet Libraries. International Patent Publication WO 2010/009365 published Jan. 21, 2010.

Miller R T. (2009) Micro-Channels, Micro-Mixers, and Micro-Reactors. United States Patent Publication US 2009/0092526 published Apr. 9, 2009.

Noroozi Z, Kido H, et al. (2009) Reciprocating flow-based centrifugal microfluidics mixer. *The Review of scientific instruments.* 80(7), 075102-075102.

Pugia M J, Schulman L S, Kuo H H, Blankenstein G. (2008) Mixing in Microfluidic Devices. U.S. Pat. No. 7,347,617 issued Mar. 25, 2008.

Robertson R M, Laib S, et al. (2006) Diffusion of isolated DNA molecules: dependence on length and topology. *Proceedings of the National Academy of Sciences of the United States of America.* 103(19), 7310-7314.

Stroock A D, Dertinger S K W, et al. (2002) Chaotic mixer for microchannels. *Science.* 295(5555), 647-651.

Suh Y K, Kang S. (2010) A Review on Mixing in Microfluidics. *Micromachines.* 1(3), 82-111.

Teh S-Y, Lin R, Hung L-H, Lee A P. (2008) Droplet microfluidics. *Lab on a Chip.* 8, 198-220.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

The invention claimed is:

1. A centrifugal microfluidic device comprising a microfluidic mixing chamber with at least two inlets from respective microfluidic channels with hydraulic diameters less than 1 mm, for permitting fluid flows to enter the chamber from each channel under the influence of a centrifugal field, the inlets spaced apart so that trajectories of the fluid do not intersect a mixing surface in the chamber at substantially a same place on the surface, the chamber having at least one deflection element situated in the trajectories, the at least one deflection element oriented to deflect the flow so that the deflected flows contact the mixing surface at substantially a same place on the surface, where a trajectory from the deflection element to the mixing surface has a distance of at least 1 mm, so that microscopic amounts of the fluid flows impact the surface, or the previously deposited fluid, spreading out to form a stack of alternating thin layers of the respective fluids, providing a large surface area for diffusion.

2. The device according to claim 1, wherein the deflection element comprises a solid feature engineered into the mixing chamber.

3. The device according to claim 2, wherein the solid feature comprises a single wing.

4. The device according to claim 2, wherein the solid feature comprises multiple wings.

5. The device according to claim 1, wherein the inlets are spaced apart by a distance at least as large as the diameter of the channels.

6. The device according to claim 1, wherein substantially the same place comprises a separation of no more than the diameter of the microfluidic channels.

7. The device according to claim 1, wherein the deflection element has a straight geometry, a curved geometry or a combination of straight and curved geometries.

8. The device according to claim 1, wherein the microfluidic channels are each connected to a respective reservoir, the volumes of each reservoir being less than 1 ml.

9. The device according to claim 8 wherein the reservoir contains: a liquid, a liquid potentially containing a cell, a liquid potentially containing a virus, a liquid potentially containing a bacteria, a liquid potentially containing particulate matter, a liquid potentially containing particulate matter that is surface activated, or a liquid potentially containing a magnetic particle.

10. The device according to claim 1, wherein the chamber has an outlet, the outlet having a position projected onto the trajectories of at least 1 mm below the deflector.

11. The device according to claim 10, wherein the outlet is in fluid communication with a secondary mixing chamber via a third microfluidic channel with a hydraulic diameter less than 1 mm, where the secondary mixing chamber provides an unobstructed trajectory having a distance of at least 1 mm prior to contact with a mixing surface.

12. The device according to claim 11, wherein the secondary mixing chamber has a second inlet, and respective one or more deflectors for mixing the fluid from the microfluidic mixing chamber with another fluid.

13. A method for mixing at least two flows of fluid in a centrifugal microfluidic device, the method comprising:

a. providing at least two microfluidic inlets in a mixing chamber of the device with hydraulic diameters less than 1 mm, b. creating a fluid flow through each inlet under influence of a centrifugal field, the inlets spaced apart in the chamber so that straight line trajectories of the flows, c. intersect a mixing surface in the chamber at substantially different places on the surface; and d. deflecting the fluid flows before the flows contact the mixing surface so that the flows contact the mixing surface at substantially the same place;

e. providing an unobstructed trajectory between the deflector and mixing surface having a distance of at least 1 mm so that microscopic amounts of the fluid flows impact the surface, or the previously deposited fluid, spreading out to form a stack of alternating thin layers of the respective fluids, providing a large surface area for diffusion.

14. The method of claim 13, wherein the deflecting is accomplished by providing a solid deflection element engineered into the mixing chamber in the trajectories of the inlet, the deflection element having a deflecting surface disposed at an oblique angle with respect to the centrifugal field.

* * * * *